(12) United States Patent
Kim et al.

(10) Patent No.: US 8,012,652 B2
(45) Date of Patent: Sep. 6, 2011

(54) METHOD OF FORMING A THIN FILM PATTERN AND METHOD OF FABRICATING A LIQUID CRYSTAL DISPLAY DEVICE

(75) Inventors: Jin Wuk Kim, Uiwang-si (KR); Seong Pil Cho, Seoul (KR)

(73) Assignee: LG Display Co., Ltd., Seoul (KR)

( * ) Notice: Subject to any disclaimer, the term of this patent is extended or adjusted under 35 U.S.C. 154(b) by 879 days.

(21) Appl. No.: 12/003,770

(22) Filed: Dec. 31, 2007

(65) Prior Publication Data
US 2008/0264902 A1 Oct. 30, 2008

(30) Foreign Application Priority Data
Apr. 26, 2007 (KR) .................. 10-2007-0040872

(51) Int. Cl.
*G03F 1/00* (2006.01)
*G03F 7/00* (2006.01)

(52) U.S. Cl. ...... 430/5; 430/270.1; 430/273.1; 430/302; 430/306; 430/310

(58) Field of Classification Search ................ None
See application file for complete search history.

(56) References Cited

U.S. PATENT DOCUMENTS

| | | | | |
|---|---|---|---|---|
| 4,948,700 A | * | 8/1990 | Maeda et al. | 430/280.1 |
| 5,272,980 A | * | 12/1993 | Takeuchi et al. | 101/481 |
| 7,029,805 B2 | * | 4/2006 | Ray et al. | 430/5 |
| 7,704,678 B2 | * | 4/2010 | Yoo et al. | 430/302 |

FOREIGN PATENT DOCUMENTS

| | | |
|---|---|---|
| CN | 1179557 | 4/1998 |
| CN | 1243523 | 2/2000 |
| CN | 1621943 | 6/2005 |
| CN | 1629699 | 6/2005 |
| CN | 1837958 | 9/2006 |
| CN | 1923532 | 3/2007 |

OTHER PUBLICATIONS

Grunwald et al., Derwent 1987-163384.*
Buhr et al., Derwent 1989-123853.*

* cited by examiner

*Primary Examiner* — Duy-Vu N Deo
(74) *Attorney, Agent, or Firm* — McKenna Long & Aldridge LLP

(57) ABSTRACT

A method of forming a thin film pattern includes: providing a printing roller and a substrate including a thin film; coating the printing roller with an etch-resist solution including a base polymer, a carrier solvent, a tackifier and a surfactant; removing the carrier solvent from the coated etch-resist solution thereby transitioning the etch-resist solution from liquid phase to solid phase; patterning the solid etch-resist; transferring the patterned etch-resist from the printing roller to the substrate; and patterning the thin film corresponding to the transferred etch-resist.

23 Claims, 10 Drawing Sheets

FIG.3
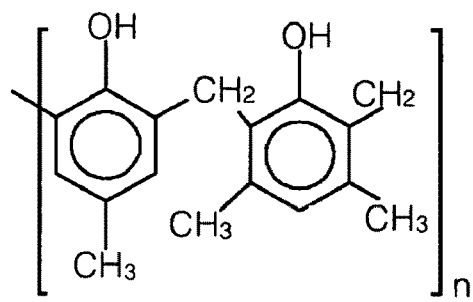
Xylenol
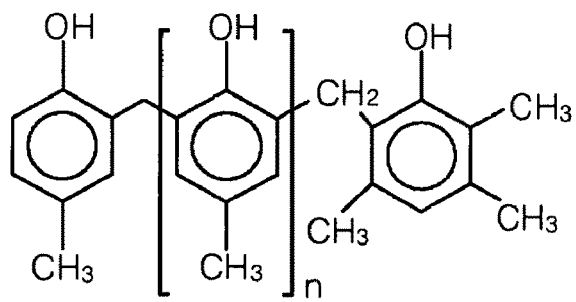
TMP
FIG.4
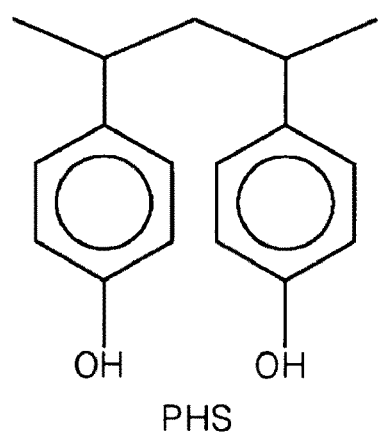
PHS

METHOD OF FORMING A THIN FILM PATTERN AND METHOD OF FABRICATING A LIQUID CRYSTAL DISPLAY DEVICE

This application claims the benefit of Korean Patent Application No. 2007-40872, filed on Apr. 26, 2007, which is hereby incorporated by reference for all purposes as if fully set forth herein.

BACKGROUND OF THE INVENTION

1. Field of the Invention

The present invention relates to fabrication of a thin film pattern of a display panel, and more particularly, to an apparatus for fabricating a thin film pattern, in which cost savings may be realized due to prolongation of a blanket lifespan and reliability of the thin film pattern may be improved, and a method for fabricating the thin film pattern with the apparatus.

2. Discussion of the Related Art

Recently, a variety of flat panel displays capable of relieving disadvantages, e.g., heaviness and bulkiness, of cathode ray tubes (CRTs), have drawn a great deal of attention. Examples of flat panel displays include liquid crystal displays (LCDs), field emission displays (FEDs), plasma display panels (PDPs) and electro-luminescent displays (ELDs).

Of these, LCDs control light transmittance of liquid crystal by an electric field to display an image. In order to realize such a mechanism, LCDs include a LCD panel, where LCD cells are arranged in the form of an active matrix, and driving circuits to drive the LCD panel.

The LCD panel includes: a thin film transistor array substrate and a color filter array substrate arranged such that they face each other; and a spacer arranged between the two substrates to maintain a cell gap; and a liquid crystal sealing the cell gap.

The thin film transistor array substrate includes a plurality of gate lines and a plurality of data lines, a thin film transistor formed as a switching element at an intersection between each of the gate lines and each of the data lines, a pixel electrode in contact with the thin film transistor at each of liquid crystal cells, and an alignment film arranged over the entire surface of the thin film transistor array substrate including the resulting structure. The gate and data lines receive a signal through respective pad parts from the driving circuits. The thin film transistor supplies a pixel signal through a data line to the pixel electrode in response to a scanning signal received through the gate line.

The color filter array substrate includes a plurality of color filters arranged at respective liquid crystal cells, a black matrix to partition the color filters and reflect external light, a common electrode to commonly supply a reference voltage to the liquid crystal cells, and an alignment film arranged over the entire surface of the color filter array substrate including the resulting structure.

The thin film transistor array substrate and color filter array substrate are separately formed and joined to each other, and a liquid crystal is inserted between the two substrates and then sealed, to complete fabrication of an LCD panel.

In the related art, thin film patterns in a LCD panel are formed through photolithographic and etching processes. However, photolithographic processes involve a series of steps such as exposing, developing, cleaning and testing, thus making LCD fabrication costs expensive. Accordingly, reverse resist printing is recently used in the related art to pattern thin films, instead of the photolithographic process.

According to the reverse resist printing, an etch-resist solution is coated on a blanket wound around a printing roller of an etch-resist solution injection apparatus and transferred to a protrusion only of a printing plate. Thus, the etch-resist solution is left on the printing roller having a desired thin film pattern, and the etch-resist pattern is then transferred to a substrate to fabricate the thin film pattern on the substrate. The etch-resist solution used for the reverse resist printing consists of a base polymer such as novolac, a carrier solvent, a printing solvent and a surfactant.

The carrier solvent is a solvent used to lower the viscosity of the etch-resist solution discharged from the injection apparatus thereby allowing the etch-resist solution to be uniformly coated on the blanket.

The printing solvent imparts tackiness or stickiness to the etch-resist solution coated on the blanket, in order to allow the etch-resist solution to be efficiently coated on a printing plate or substrate.

The surfactant is a substance which readily adheres to an interface and greatly lowers surface tension with the interface, and is used herein to lower surface tension of the etch-resist solution.

As shown in FIG. 1, when coated on a printing roller, the etch-resist solution is liquid. At this time, the etch-resist solution can be uniformly coated on the blanket of the printing roller, due to the carrier solvent contained therein. Then, the highly volatile carrier solvent is removed from the etch-resist solution. As a result, the etch-resist solution undergoes phase-transition from liquid to gel.

Then, in a printing process, the printing solvent is gradually removed, and the etch-resist is formed on the substrate, and is then subjected to curing and baking. As a result, the etch-resist is solidified.

Accordingly, the carrier solvent is removed immediately after coating, but the printing solvent remains on the etch-resist and permeates into the blanket during printing. As a result, swelling of the blanket (hereinafter, referred to as "swelling") occurs, which greatly prevents the etch-resist from being normally formed on the substrate, as shown in FIG. 2. Accordingly, problems occur, e.g., severe deterioration in reliability of thin film pattern formation and in blanket lifespan.

SUMMARY OF THE INVENTION

Accordingly, the present invention is directed to method of forming a thin film pattern and a method of fabricating a liquid crystal display panel device An advantage of the present invention is to provide methods in which cost savings may be realized due to prolongation of a blanket lifespan.

Another advantage of the present invention is to provide methods in which reliability of the thin film pattern may be improved.

Another advantage of the present invention is to provide methods which do not damage a blanket.

Additional features and advantages of the invention will be set forth in part in the description which follows and in part will be apparent from the description or may be learned from practice of the invention. These and other advantages of the invention will be realized and attained by the structure particularly pointed out in the written description and claims hereof as well as the appended drawings.

To achieve these and other advantages and in accordance with the purpose of the invention, as embodied and broadly described, a method of forming a thin film pattern includes: providing a printing roller and a substrate including a thin film; coating the printing roller with an etch-resist solution including a base polymer, a carrier solvent, a tackifier and a surfactant; removing the carrier solvent from the coated etch-resist solution thereby transitioning the etch-resist solution from liquid phase to solid phase; patterning the solid etch-resist; transferring the patterned etch-resist from the printing roller to the substrate; and patterning the thin film corresponding to the transferred etch-resist.

In another aspect of the present invention, a method of forming a thin film pattern includes: providing a printing roller and a substrate including a thin film; coating the printing roller with an etch-resist solution including a base polymer, a carrier solvent, a tackifier and a surfactant; removing the carrier solvent from the coated etch-resist solution thereby transitioning the etch-resist solution from liquid phase to solid phase; patterning the solid etch-resist; transferring the patterned etch-resist from the printing roller to the substrate; and patterning the thin film corresponding to the transferred etch-resist.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 3 is a view illustrating molecular structures of xylenol and trimethylphenol (TMP);

FIG. 4 a view illustrating a molecular structure of PHS as a tackifier;

DETAILED DESCRIPTION OF THE ILLUSTRATED EMBODIMENTS

Reference will now be made in detail to embodiments of the present invention, examples of which are illustrated in the accompanying drawings. Wherever possible, the same reference numbers will be used throughout the drawings to refer to the same or like parts.

Referring to FIGS. 3 to 9D, embodiments of the present invention will be described.

An etch-resist solution may include a base polymer, a carrier solvent, a tackifier and a surfactant. To improve visibility, the etch-resist solution may further include a dye.

The base polymer may be selected to have a molecular weight of about 2,000 to about 100,000. The base polymer may include meta-cresol, novolac, para-cresol novolac and a combination thereof. The base polymer may include xylenol or trimethylphenol (TMP), as shown in FIG. 3. The base polymer may be contained in an amount of about 3 to about 30 wt % of the etch-resist solution.

The carrier solvent may include methanol, ethanol, isopropanol or butanol. The carrier solvent may be selected to have a boiling point of about 100° C. or less.

The carrier solvent may be selected to lower the viscosity of the etch-resist solution, thereby allowing the etch-resist solution to be uniformly coated on the blanket. The carrier solvent is removed after coating. The carrier solvent may be contained in an amount of about 50 to about 90 vol % of the etch-resist solution.

The etch-resist solution requires no printing solvent. Instead, a tackifier may be selected to have tackiness or stickiness. The tackifier may be selected such that when the etch-resist solution is coated on a printing roller and a highly volatile carrier solvent is then removed, the etch-resist solution undergoes phase-transition from liquid to solid. The etch-resist may include a viscose tackifier.

Accordingly, the etch resist is available in the solid state for a printing process.

Accordingly, it is possible to prevent the swelling problem which results from permeation of the solvent into the blanket. As a result, an accurate and reliable printing process is realized, and thin film pattern formation reliability and blanket lifespan are thus improved.

Examples of the tackifier that can be used include acryl, melamine, urethane-based polymers, and polyhydroxystyrene (PHS) having a plurality of hydroxyl (OH—) groups.

Figure 5:
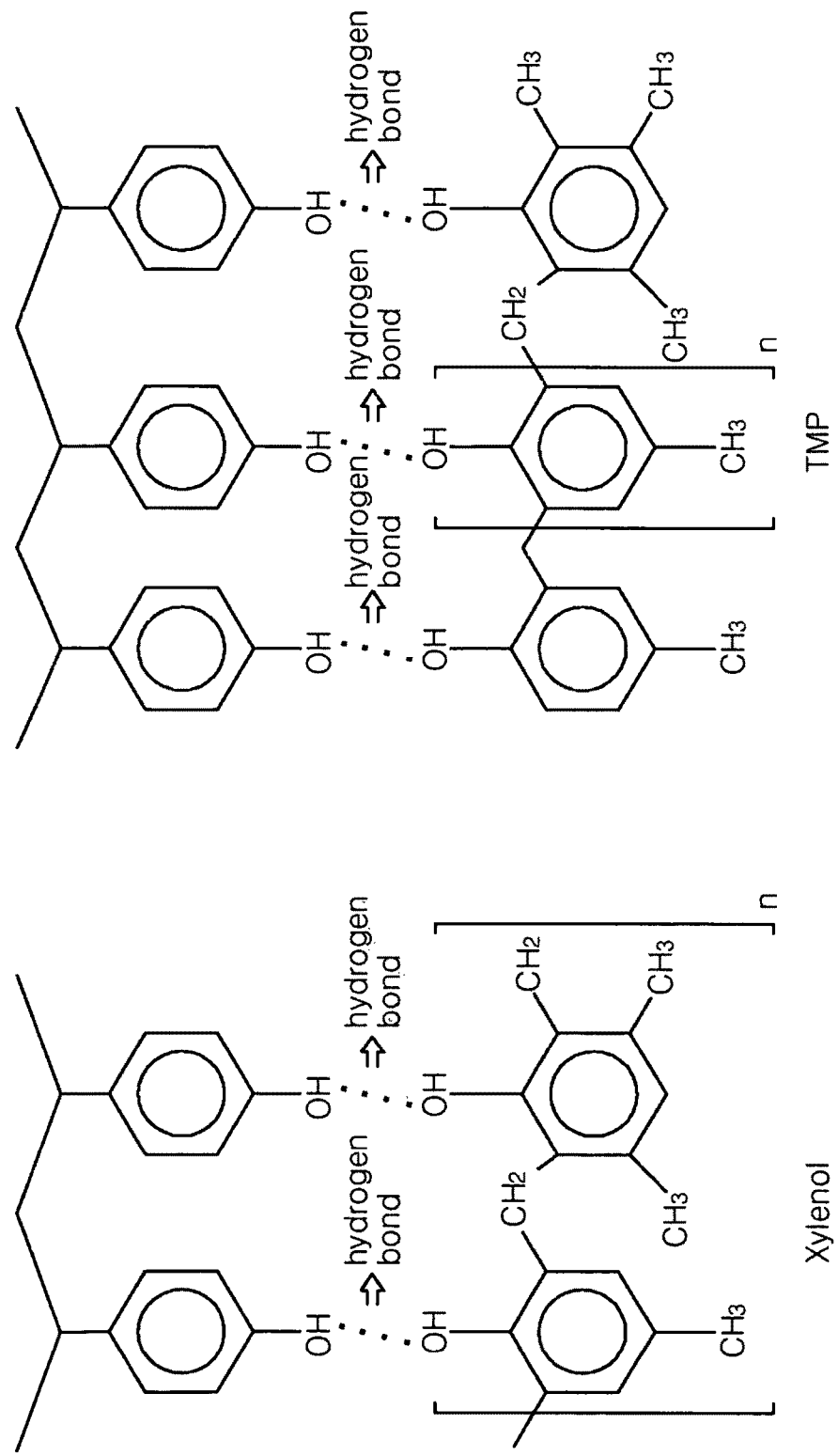
FIG. 5 is a view illustrating hydrogen bonds between PHS and xylenol, and PHS and TMP.

PHS has a plurality of hydroxyl (OH—) groups, as represented by a molecular structure in FIG. 4. Each of the hydroxyl groups of the PHS is combined with a hydroxyl group of the base polymer to form a hydrogen bond. For example, as shown in FIG. 5, there occurs a strong hydrogen bond between hydrogen (or oxygen) in the hydroxyl group of PHS and oxygen (or hydrogen) in the hydroxyl group (OH—) of xylenol. Alternatively, there occurs a strong hydrogen bond between hydrogen (or oxygen) in the hydroxyl group of PHS and oxygen (or hydrogen) in the hydroxyl group (OH—) of TMP. As a result, the viscose PHS is strongly bound to the base polymer, and the etch-resist is thus suitably transferred to a printing plate and is desirably printed on the substrate.

Accordingly, the tackifier and the base polymer may be bound to each other through a hydrogen bond only and not chemically bound to each other. Thus, the solid etch-resist has a molecular structure in which the tackifier is dispersed around the base polymer.

The tackifier may be included in an amount of about 10 to about 50 vol % of the etch-resist solution.

Examples of the surfactant that may be used include an acid including stearic acid, palmitic acid, lauric acid and oleic acid. In addition, examples of the surfactant include sulfonate such as dioctyl(2-ethylhexyl) sulfosuccinate, phosphate ester, FOS-100($CF_3(CF_2)_4(CH_2CH_2O)_{10}$) and FSN-100($CF_3(CF_2)_5(CH_2CH_2O)_{14}$). The surfactant may be contained in an amount of about 0.01 to about 3 wt % of the etch-resist solution.

The etch-resist formed on a substrate by reverse printing may include dye to improve visibility. The dye may be contained in an amount of about 0.01 to about 1 wt % of the etch-resist solution.

Examples of the dye include dimethyl amino-phenyl and ethyl amino-phenyl. More specifically, fluoro-containing dye including bis(4-N-N-dimethylamino-phenyl)-(2-fluorophenyl)-methane, and bis(4-N-N-dimethylamino-phenyl)-(2-fluorophenyl)acetonitrile may be used.

Figure 6:
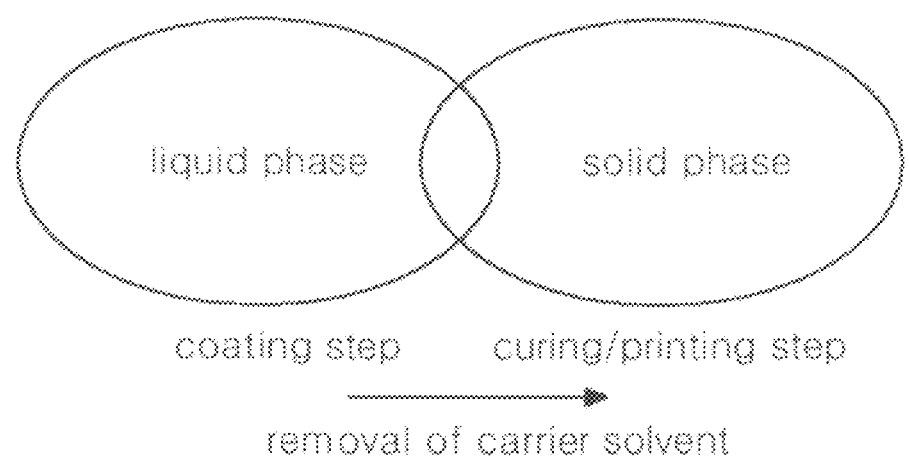
FIG. 6 is a view illustrating phase-transition of the etch-resist solution according to an embodiment of the present invention.

FIG. 6 is a view illustrating phase-transition of the etch-resist solution including the afore-mentioned ingredients.

When coated on a printing roller, the etch-resist solution is a liquid. Accordingly, the etch-resist solution may be uniformly coated on a blanket of the printing roller, due to the carrier solvent contained therein. Then, the highly volatile carrier solvent may be removed from the etch-resist solution. As a result, the etch-resist solution undergoes phase-transition from liquid to solid.

Accordingly, a printing process may be performed using an etch-resist in a solid (not gel) phase. That is, because the etch-resist layer is formed by printing the solid etch-resist and is then subjected to curing and baking, the blanket is not damaged by the solvent during the printing. As a result, a lifespan of the blanket may be prolonged and an etch-resist is properly formed on a substrate, thereby the reliability of the thin film pattern formation can be improved.

Figure 1:
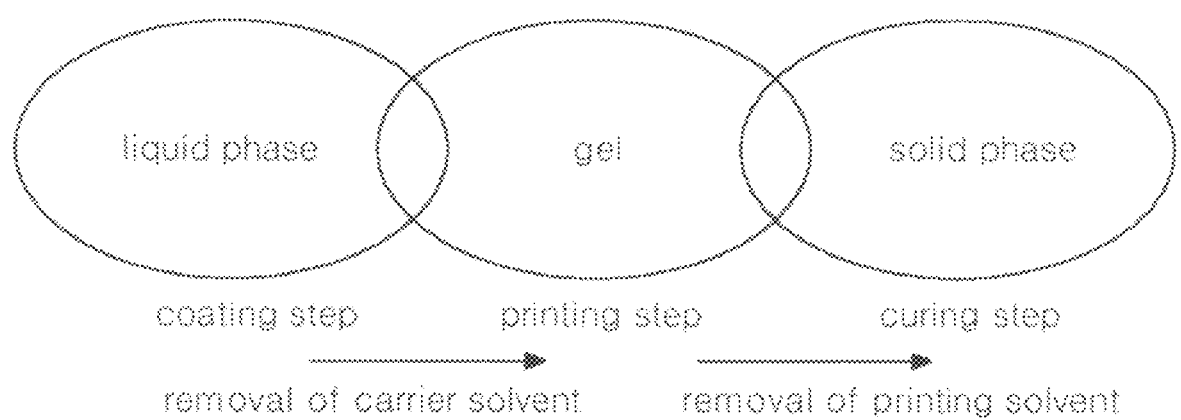
FIG. 1 is a view illustrating phase-transition of a related art etch-resist solution.
Figure 2:
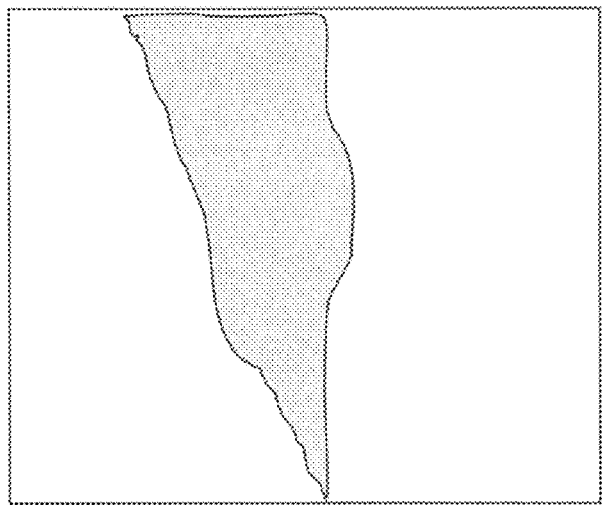
FIG. 2 is a photograph illustrating an etch-resist formed on a substrate by reverse resist printing using a related art etch-resist solution.
Figure 7:
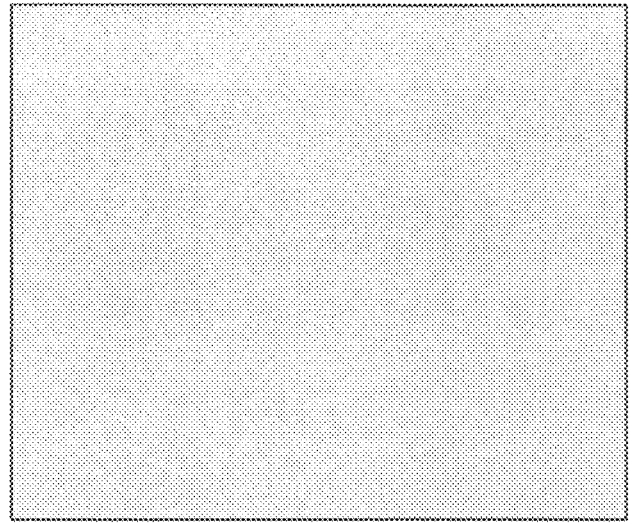
FIG. 7 is a photograph illustrating an etch-resist formed on a substrate by reverse resist printing using the etch-resist solution according to an embodiment of the present invention.

FIG. 7 is a photograph illustrating a state in which an etch-resist is formed on a substrate by reverse resist printing using the etch-resist solution of an embodiment of the present invention. It can be confirmed from FIG. 7 that the etch-resist is properly formed on the substrate, unlike the photograph illustrated in FIG. 2.

The use of the etch-resist solution enables the etch-resist to be properly formed on the substrate, thus forming the thin film pattern with reliability. As well, the use of the solid-state etch-resist during printing enables prevention of damage to the blanket, thus prolonging the lifespan of the blanket.

Hereinafter, referring to FIGS. 8A to 8E, an apparatus for fabricating a thin film pattern and a method for fabricating the same with the apparatus will be illustrated.

Figure 8A:
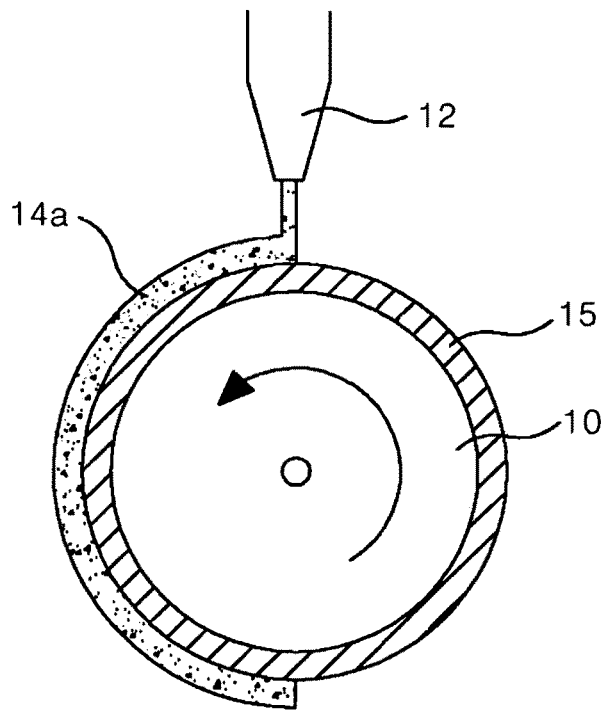
FIG. 8A to 8E are views illustrating an apparatus for fabricating a thin film pattern and a method for fabricating the same using the apparatus.

First, as shown in FIG. 8A, an etch-resist solution 14a is injected onto the blanket 15 winding around a printing roller 10 from an injection nozzle 12. The printing roller 10 rotates, allowing the etch-resist solution 14a to be uniformly coated over the blanket 15.

After coating, the carrier solvent is removed from the etch-resist solution 140a. Accordingly, the etch-resist solution 140a transitions from liquid to solid.

Figure 8B:
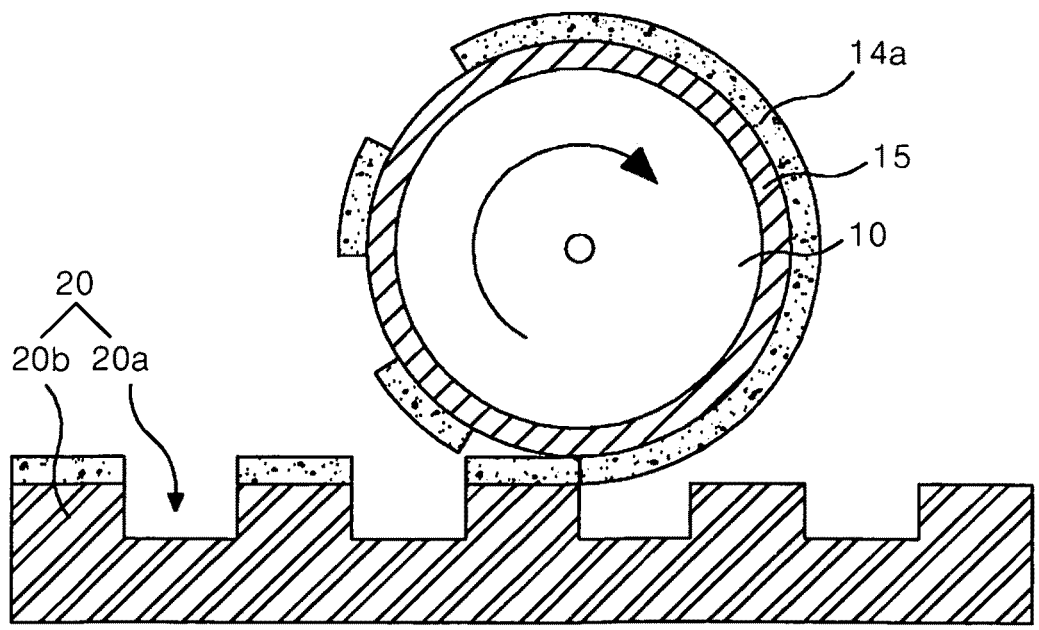
Figure 8C:
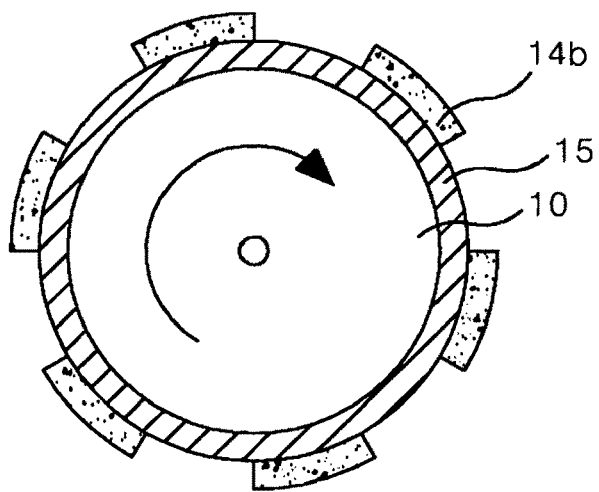

As shown in FIG. 8B, the printing roller 10 is rotated, while allowing the solid etch-resist 14a to be in contact with a printing plate 20, to transfer the solid etch-resist 14a to only a protrusion 20b of the printing plate 20. As a result, as shown in FIG. 8C, an etch-resist pattern 14b having a desired thin film pattern remains on the printing roller 10.

Figure 8D:
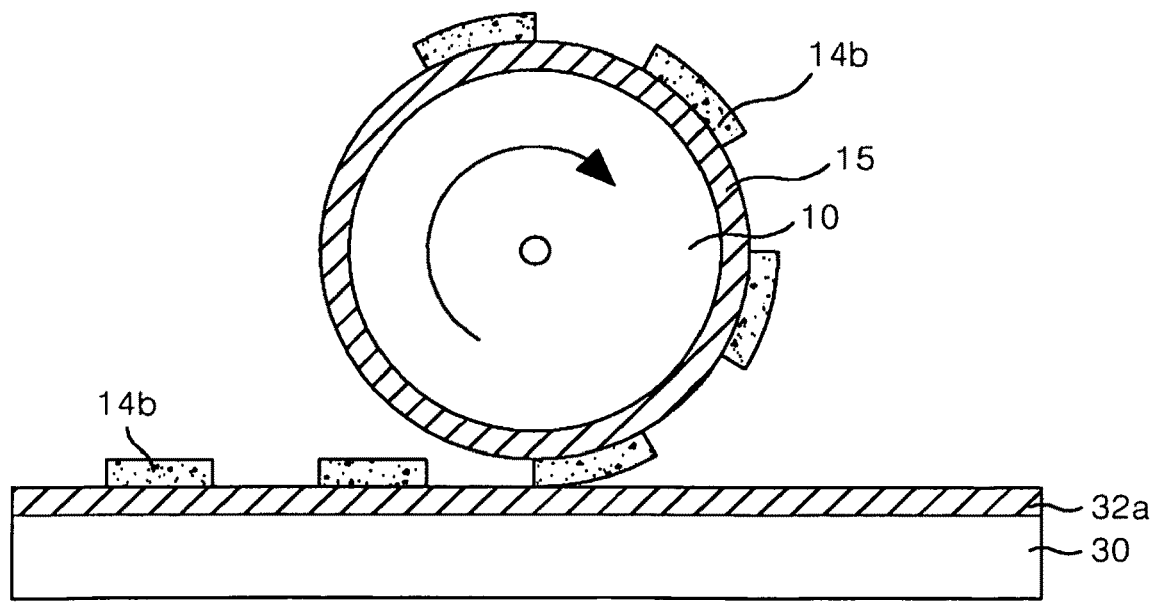
Figure 8E:
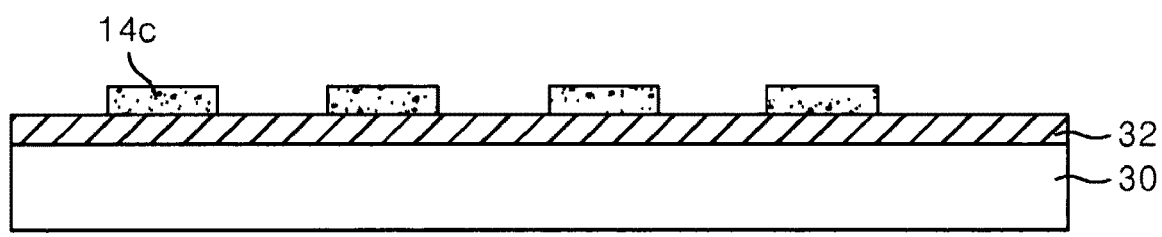

As shown in FIG. 8D, the etch-resist pattern 14b transferred to the printing roller 10 is transferred to a predetermined layer 32a, for example, to a substrate 30, where a metal layer 32a is formed, and the metal layer is then cured. As a result, an etch-resist pattern 14c is formed to pattern the metal layer 32a, as shown in FIG. 8E. Then, a region, where the metal layer 32a does not overlap the etch-resist pattern 14c, is patterned, and the desired thin film pattern can be thus fabricated on the substrate 30.

As such, the apparatus for fabricating a thin film pattern and the method for fabricating the same using the apparatus may be used to form thin film patterns of the liquid crystal displays.

FIGS. 9A to 9D are views roughly illustrating a method of manufacturing an LCD device.

Figure 9A:
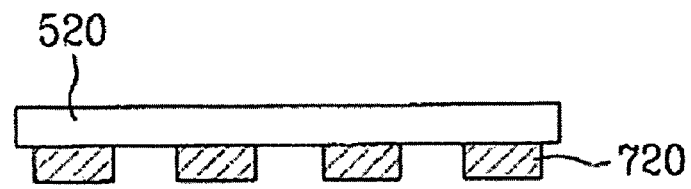
FIGS. 9A to 9D are cross section views of roughly illustrating a method of manufacturing an LCD device according to an embodiment of the present invention.
Figure 9B:
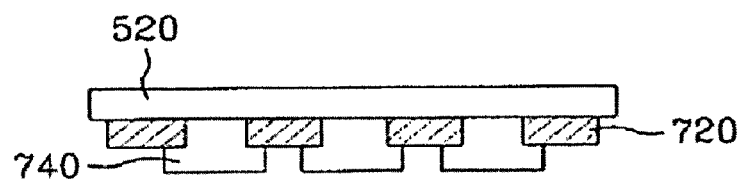

As shown in FIG. 9A, a light-shielding layer 720 is formed on a first substrate 520. Then, as shown in FIG. 9B, a color filter layer 740 is formed on the first substrate 520 including the light-shielding layer 720. At this time, at least any one of processes of forming the light-shielding layer 720 (FIG. 9A) and forming the color filter layer 740 (FIG. 9B) is carried out by the above-mentioned patterning method.

Figure 9C:

As shown in FIG. 9C, a second substrate 550 is prepared. Although not shown, the second substrate 550 is formed by steps of forming gate and data lines crossing each other to define pixel regions, forming a thin film transistor at each crossing point of the gate and data lines, and forming a pixel electrode connected with the thin film transistor.

Figure 9D:
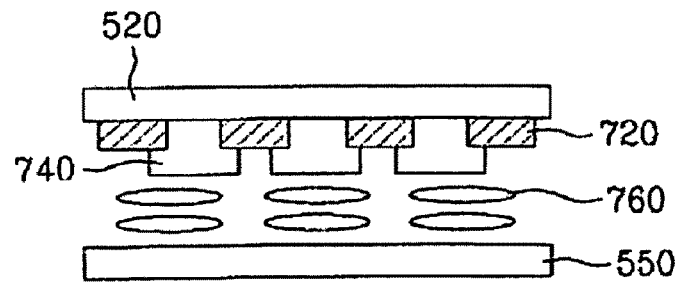

Then, a liquid crystal layer 760 is formed between the first and second substrates 520 and 550, as shown in FIG. 9D.

Furthermore, the apparatus and method may be utilized in a variety of displays including field emission displays (FEDs), plasma display panels (PDPs) and organic light-emitting diodes (OLEDs).

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a LCD device, comprising:
   preparing a thin film transistor substrate and a color filter substrate,
   wherein the preparing at least one of the thin film transistor substrate and the color filter substrate includes the steps of:
   providing a printing roller;
   coating the printing roller with an etch-resist solution including a base polymer, a carrier solvent, a tackifier and a surfactant;
   removing the carrier solvent from the coated etch-resist solution thereby transitioning the etch-resist solution from liquid phase to solid phase;
   patterning the solid etch-resist;
   transferring the patterned etch-resist from the printing roller to the substrate; and
   patterning a thin film of the substrate corresponding to the transferred etch-resist; and
   providing a liquid crystal layer between the thin film transistor substrate and color filter substrate;
   bonding the thin film transistor substrate and the color filter substrate; and
   wherein the tackifier is used polyhydroxystyrene (PHS) having a plurality of hydroxyl (OH$^-$) groups and the PHS is combined with a hydroxyl group of the base polymer to form a hydrogen bond.

2. The method of claim 1, wherein the thin film pattern is at least one of a gate electrode, a source electrode, a drain electrode, and a pixel electrode of the thin film transistor substrate.

3. The method of claim 1, wherein the thin film pattern is at least one of a light-shielding layer and a color filter layer of the color filter substrate.

4. The method of claim 1, wherein the printing roller includes a blanket around the printing roller.

5. The method of claim 1 wherein patterning the solid etch-resist includes:
providing a printing plate including a groove and a protrusion; and
rotating the printing roller, while allowing the solid etch-resist to be in contact with the protrusion of the printing plate, to transfer the solid etch-resist to the protrusion.

6. The method of claim 1, wherein transferring the patterned etch-resist from the printing roller to the substrate includes:
rotating the printing roller, while allowing the patterned etch-resist to be in contact with the substrate, to transfer the solid etch-resist to the substrate.

7. The method of claim 1, wherein patterning the thin film corresponding to the transferred etch-resist includes:
etching the thin film where the etch-resist pattern does not overlap with the thin film; and
removing the etch-resist pattern.

8. The method of claim 1, wherein the tackifier is included in an amount of about 10 to about 50 vol % of the etch-resist solution.

9. A method of forming a thin film pattern comprising:
providing a printing roller and a substrate including a thin film;
coating the printing roller with an etch-resist solution including a base polymer, a carrier solvent, a tackifier and a surfactant;
removing the carrier solvent from the coated etch-resist solution thereby transitioning the etch-resist solution from liquid phase to solid phase;
patterning the solid etch-resist;
transferring the patterned etch-resist from the printing roller to the substrate;
patterning the thin film corresponding to the transferred etch-resist; and
wherein the tackifier is used polyhydroxystyrene (PHS) having a plurality of hydroxyl ($OH^-$) groups and the PHS is combined with a hydroxyl group of the base polymer to form a hydrogen bond.

10. The method of claim 9, wherein the printing roller includes a blanket around the printing roller.

11. The method of claim 9, wherein patterning the solid etch-resist includes:
providing a printing plate including a groove and a protrusion; and
rotating the printing roller, while allowing the solid etch-resist to be in contact with the protrusion of the printing plate, to transfer the solid etch-resist to the protrusion.

12. The method of claim 9, wherein transferring the patterned etch-resist from the printing roller to the substrate includes:
rotating the printing roller, while allowing the patterned etch-resist to be in contact with the substrate, to transfer the solid etch-resist to the substrate.

13. The method of claim 9, wherein patterning the thin film corresponding to the transferred etch-resist includes:
etching the thin film where the etch-resist pattern does not overlap with the thin film; and
removing the etch-resist pattern.

14. The method of claim 9, wherein the carrier solvent includes at least one of methanol, ethanol, isopropanol, butanol and a combination thereof.

15. The method of claim 9, wherein the carrier solvent is included in an amount of about 50 to about 90 vol % of the etch-resist solution.

16. The method of claim 9, wherein the base polymer includes at least one of meta-cresol, novolac, para-cresol novolac, xylenol, trimethylphenol (TMP) and a combination thereof.

17. The method of claim 9, wherein the base polymer is included in an amount of about 3 to about 30 wt % of the etch-resist solution.

18. The method of claim 9, wherein the tackifier is included in an amount of about 10 to about 50 vol % of the etch-resist solution.

19. The method of claim 9, wherein the surfactant includes at least one of acid, sulfonate, phosphate ester, FOS-100($CF_3$ $(CF_2)_4(CH_2CH_2O)_{10}$), FSN-100($CF_3$ $(CF_2)_5(CH_2CH_2O)_{14}$) and a combination thereof.

20. The method of claim 9, wherein the surfactant is included in an amount of about 0.001 to about 3 wt % of the etch-resist solution.

21. The method of claim 9, wherein the etch-resist solution further includes a dye.

22. The method of claim 21, wherein the dye includes at least one of dimethyl amino-phenyl and ethyl amino-phenyl.

23. The method of claim 9, wherein the etch-resist solution includes about 3 to about 30 wt % of the base polymer, about 50 to about 90 vol % of the carrier solvent, about 10 to about 50 vol % of the tackifier, about 0.01 to about 3 wt % of the surfactant and about 0.01 to about 1 wt % of a dye.

* * * * *